US008601355B2

(12) United States Patent
Purkovic et al.

(10) Patent No.: US 8,601,355 B2
(45) Date of Patent: Dec. 3, 2013

(54) SYSTEM AND METHOD FOR DETERMINING PARITY BIT SOFT INFORMATION AT A TURBO DECODER OUTPUT

(75) Inventors: Aleksandar Purkovic, Potomac, MD (US); Brian Francis Johnson, Kensington, MD (US); Slobodan Jovanovic, Bethesda, MD (US); Steven Alan Tretter, Silver Spring, MD (US)

(73) Assignee: Texas Instruments Incorporated, Dallas, TX (US)

( * ) Notice: Subject to any disclaimer, the term of this patent is extended or adjusted under 35 U.S.C. 154(b) by 883 days.

(21) Appl. No.: 12/472,719

(22) Filed: May 27, 2009

(65) Prior Publication Data

US 2009/0300463 A1    Dec. 3, 2009

Related U.S. Application Data

(60) Provisional application No. 61/056,673, filed on May 28, 2008.

(51) Int. Cl.
*H03M 13/03* (2006.01)

(52) U.S. Cl.
USPC ........................................................ 714/796

(58) Field of Classification Search
USPC ........................................................ 714/796
See application file for complete search history.

(56) References Cited

U.S. PATENT DOCUMENTS

| 5,933,462 | A  | * | 8/1999  | Viterbi et al. | 375/341 |
|-----------|----|---|---------|----------------|---------|
| 7,116,732 | B2 | * | 10/2006 | Worm et al.    | 375/341 |
| 7,203,893 | B2 | * | 4/2007  | Kerr et al.    | 714/780 |
| 2004/0225940 | A1 | * | 11/2004 | Kerr et al. | 714/752 |
| 2007/0136649 | A1 |   | 6/2007  | Seo et al.   |        |
| 2009/0019332 | A1 | * | 1/2009  | Hekstra et al. | 714/752 |

FOREIGN PATENT DOCUMENTS

WO    WO 2007/106876    9/2007

OTHER PUBLICATIONS

Bahl et al., "Optical Decoding of Linear Codes of Minimizing Symbol Error Rate," (Mar. 1974), "IEEE Transactions of Information Theory," pp. 264-287.

\* cited by examiner

*Primary Examiner* — Albert Decady
*Assistant Examiner* — Enam Ahmed
(74) *Attorney, Agent, or Firm* — Steven A. Shaw; W. James Brady; Frederick J. Telecky, Jr.

(57) ABSTRACT

A decoding circuit, is provided, comprising: a turbo decoder configured to receive a input systematic bit soft information values and input parity bit information values, and to generate output systematic bit soft information values and hard decoded bits according to a turbo decoding operation; and a parity bit soft information generation circuit configured to receive the input systematic bit soft information values, the input parity bit soft information values, and the output systematic bit soft information values; to determine initial forward metrics, initial backward metrics, and branch metrics as a function of the input parity bit soft information values and the output systematic bit soft information values; to determine output parity bit soft information values based on the branch metrics, the initial forward metrics, and the initial backward metrics; and to provide the output parity bit soft information values as a signal output.

23 Claims, 5 Drawing Sheets

SYSTEM AND METHOD FOR DETERMINING PARITY BIT SOFT INFORMATION AT A TURBO DECODER OUTPUT

CROSS-REFERENCE TO RELATED APPLICATION

This application claims the benefit of the following Provisional application 61/056,673 filed 28 May 2008, which is expressly incorporated herein by reference.

TECHNICAL FIELD

The technical field relates in general to communications, and, more specifically, method for computation of a parity bit soft output in a signal decoder circuit.

BACKGROUND

It is very often advantageous in a digital communication receiver to use feedback between constituent functional blocks. This is especially true in the case of wireless receivers where the cooperative operation of the channel estimation/equalization block with the subsequent decoding block can lead to significant performance improvements. Such schemes bear different names such as turbo equalization, successive interference cancellation, or the like. This cooperative operation is often performed in an iterative fashion.

In order to have this kind of feedback operation feasible, soft bit information, usually in the form of log-likelihood-ratio (LLR) corresponding to all the bits at the turbo decoder output have to be available. This includes both systematic bits (i.e., information bits) and parity bits. However, in a conventional implementation, a turbo decoder iteratively computes LLR values only for the systematic (i.e., information) bits. These are then hard decoded and sent out for further processing.

Typical turbo decoders do not provide the information that would be required for the implementations of advanced receiver techniques (e.g., turbo equalization, advanced interference cancellation techniques, etc.) in digital communication receivers, especially in the area of wireless communications. In particular, a conventional turbo decoder does not compute any kind of soft output related to the parity bits of an encoded data stream. In other words, a typical turbo decoder does not have the capability to provide LLR (soft output) values for parity bits, which is the form that a receiver system would require soft output information.

It would therefore be desirable to provide a turbo decoder circuit that provides soft outputs (i.e., LLR values) as feedback for both systematic bits and parity bits. It is further desirable that this circuit do so using only input LLR values received by the turbo decoder, and a fed back systematic soft output from the turbo decoder.

SUMMARY

Embodiments described herein provide a system and method for generating revised parity bit soft information (e.g., LLR values) based on the input signals provided to a turbo decoder and the output signals provided from a turbo decoder. Such methods and systems can be used integrally with a turbo decoder, or as an additional circuit or method attached to a turbo decoding circuit or method.

Accordingly, a first embodiment described herein provides a decoding circuit, comprising: a turbo decoder configured to receive a plurality of input systematic bit soft information values and a plurality of input parity bit information values, and to generate a plurality of output systematic bit soft information values and a plurality of hard decoded bits according to a turbo decoding operation; and a parity bit soft information generation circuit configured to receive the plurality of input systematic bit soft information values, the plurality of input parity bit soft information values, and the plurality of output systematic bit soft information values; to determine a plurality of initial forward metrics; to determine a plurality of initial backward metrics; to determine a plurality of branch metrics as a function of the plurality of input parity bit soft information values and the plurality of output systematic bit soft information values; to determine a plurality of output parity bit soft information values based on the branch metrics, the plurality of initial forward metrics, and the plurality of initial backward metrics; and to provide the plurality of output parity bit soft information values as a signal output.

A second embodiment described herein provides a method for computing parity bit soft information, comprising: receiving a plurality of input parity bit soft information values corresponding to a plurality of parity bits; receiving a plurality of output systematic bit soft information values that are derived in part from the input systematic bit soft information value in a decoding operation; determining a plurality of initial forward metrics and a plurality of initial backward metrics; determining a plurality of branch metrics as a function of the plurality of input parity bit soft information values and the plurality of output systematic bit soft information values; determining a plurality of output parity bit soft information values in a processor for the plurality of parity bits, respectively, based on the plurality of initial forward metrics, the plurality of initial backward metrics and the plurality of branch metrics; and providing the plurality of output parity bit soft information values to a portion of a receiver circuit.

A third embodiment described herein provides a decoding circuit, comprising: a backward metric calculator configured to receive an input trellis termination soft information value relating to an encoder that employs a plurality of parity bits, and to generate a plurality of initial backward metrics; a turbo decoder configured to receive an input systematic bit soft information value, a plurality of input parity bit information values, and the plurality of backward metrics, and to generate an output systematic bit soft information value and a hard decoded bit according to a turbo decoding operation; a trellis termination soft information calculator configured to receive the input trellis termination soft information value and the plurality of initial backward metrics, and to generate an output trellis termination bit soft information value; a parity bit soft information generation circuit configured to receive the plurality of backward metrics, the plurality of input parity bit soft information values, and the output systematic bit soft information value, to generate a plurality of initial forward metrics, to generate a plurality of branch metrics based on the plurality of input parity bit soft information values, and the output systematic bit soft information value; and to generate a plurality of output parity bit soft information values based on the plurality of initial forward metrics, the plurality of initial backward metrics, and the plurality of branch metrics.

BRIEF DESCRIPTION OF THE DRAWINGS

The accompanying figures, where like reference numerals refer to identical or functionally similar elements and which together with the detailed description below are incorporated in and form part of the specification, serve to further illustrate various exemplary embodiments and to explain various principles and advantages in accordance with the embodiments.

DETAILED DESCRIPTION

Figure 1:
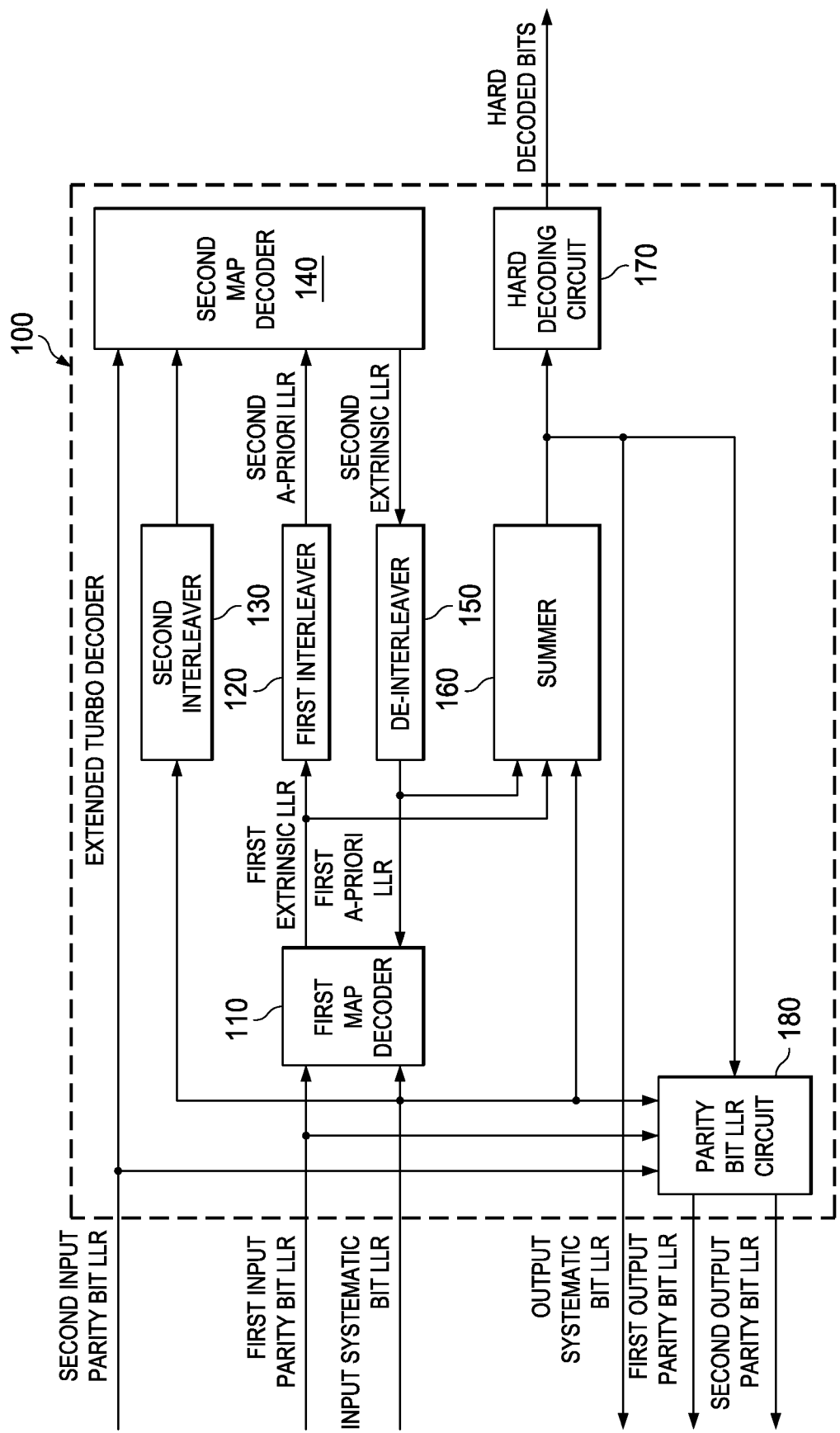
FIG. 1 is a diagram of an extended turbo decoder according to disclosed embodiments of the present invention.

In overview, the present disclosure concerns a turbo decoding method and circuit. More specifically, it relates to a circuit and related method for performing turbo decoding using parity soft bit calculation. The method and circuit provide a way of feeding back the parity soft bit information to the remainder of the receiver circuitry, which can allow that receiver circuitry to refine the operation of a channel equalizer.

The objective of providing parity soft bit feedback is accomplished by including a circuit to perform parity soft bit calculation (e.g., a parity bit LLR calculator) based on systematic and parity soft bit information received at the turbo decoder, and systematic soft bit information fed back to the rest of the receiver from the turbo decoder.

The instant disclosure is provided to further explain in an enabling fashion the best modes of performing one or more embodiments. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best supported with or in software or integrated circuits (ICs), such as a digital signal processor and software therefore, and/or application specific ICs. It is expected that one of ordinary skill, notwithstanding possibly significant effort and many design choices motivated by, for example, available time, current technology, and economic considerations, when guided by the concepts and principles disclosed herein will be readily capable of generating such software instructions or ICs with minimal experimentation. Therefore, in the interest of brevity and minimization of any risk of obscuring principles and concepts, further discussion of such software and ICs, if any, will be limited to the essentials with respect to the principles and concepts used by the exemplary embodiments.

As further discussed herein below, various inventive principles and combinations thereof are advantageously employed to determine parity bit soft information, e.g., log-likelihood-ratio (LLR) values, at an output of a turbo decoder.

Turbo Decoding While Feeding Back Parity Bit LLRs

A turbo encoder generally includes a number of constituent convolutional encoders (e.g., two in the exemplary disclosed embodiment) that operate on input information bits or their interleaved versions to generate transmit bits. This allows for parallel concatenation of the constituent simple codes.

A corresponding turbo decoder employs the same number of constituent maximum a-posteriori probability (MAP) decoders (e.g., two in the exemplary disclosed embodiment). These MAP decoders iteratively compute log-likelihood ratio (LLR) values corresponding to each information bit. The turbo decoder receives as input values the input (channel) LLR values for each encoded bit passed to it by the previous receiver block. For the $n^{th}$ code bit, $c_n$, the input LLR (i.e., soft channel output) is commonly defined as:

$$\Lambda_n^c \stackrel{def}{=} \ln \frac{p(Y_n \mid c_n = 1)}{p(Y_n \mid c_n = 0)}, \quad n = 1, 2, \ldots, N, \qquad (1)$$

where N is the total number of bits in a codeword and $Y_n$ is a received signaling element carrying bit $c_n$.

Alternately, LLR can also be defined as:

$$\Lambda_n^c \stackrel{def}{=} \ln \frac{p(Y_n \mid c_n = 0)}{p(Y_n \mid c_n = 1)}, \quad n = 1, 2, \ldots, N. \qquad (2)$$

In this case, the sign of LLR is the opposite of that shown in Equation (1), but the absolute value remains the same.

Decoding is performed in an iterative fashion, where component soft-input soft-output (SISO) MAP decoders operate cooperatively. Each component turbo decoder operates to maximize a number of estimated LLR values that correspond to a block of K information bits:

$$\Lambda_k = \ln \frac{Pr\{u_k = 1 \mid Y\}}{Pr\{u_k = 0 \mid Y\}}, \quad k = 1, 2, \ldots, K, \qquad (3)$$

where $Y = Y_1^n$ is the array of all signal elements that correspond to a current codeword related to a particular decoder. Quantities in the numerator and the denominator of Equation (3) represent a-posteriori probability functions. Because of this, the operation each component decoder implements is typically called Maximum A-posteriori Probability (MAP) decoding.

In addition, the disclosed embodiment also calculates revised LLR values for the parity bits that are fed back with the revised systematic LLR values. This is accomplished by performing a maximum a posteriori decoding operation of the error correcting codes defined on trellises (i.e., convolutional codes) for each parity bit using an appropriate decoding method. One acceptable method of generating the parity bit LLR values is the BCJR method (named for its inventors: Bahl, Cocke, Jelinek and Raviv). However, alternate decoding methods can be used in alternate embodiments. In particular, any suitable decoding method that generates output parity bit LLR values can be used.

The number of times the decoding operation is performed corresponds to the number of constituent encoders in a turbo code (i.e., the parallel concatenation of the constituent encoders). In the disclosed embodiment, two encoders are used, meaning that two passes are performed. In the first pass, the decoding operation is used to compute parity bit LLR values corresponding to the first constituent encoder; in the second pass the decoding operation is used to compute parity bit LLR values corresponding to the second constituent encoder. Embodiments with more than two encoders will perform a corresponding number of additional passes.

A more specific example using a rate 1/3 3GPP turbo code will be described below. In this example, the decoding operation is run twice. In the first pass, K LLR values corresponding to the parity bit $c_{1,k}$, k=1, 2, ..., K, (where K is the number of information bits) of the first constituent encoder ($\Lambda_{1,k,1}$, k=1, 2, ..., K) are calculated using the BCJR method. In the second pass, K LLR values corresponding to the parity bit $c_{1,k}$, k=1, 2, ..., K of the second constituent encoder ($\Lambda_{1,k,2}$, k=1, 2, ..., K) are calculated using the BCJR method.

In various circumstances, however, not all of the input LLR values will be required for this computation. In particular, some of the input values (e.g., the systematic input LLR values) may be canceled in the computation process and others (e.g., the parity input LLR values) may be cancelled if the goal is to generate the ultimate a-priori information. Thus, although the embodiments described below shows that a parity bit LLR circuit includes all of the input signals as inputs, various embodiments may use fewer than all of these inputs to calculate the output parity LLR values.

The procedure for the parity bit LLR computation thus includes the following steps: (1) perform turbo decoding using a number of turbo iterations to generate output (i.e., feedback) systematic bit LLR values; and (2) run a single decoding operation for each constituent code to generate its output (i.e., feedback) parity bit LLR values using the input systematic bit LLR values as well as channel LLR values for all the bits (i.e., the input LLR values).

Decoding Circuit

FIG. 1 is a diagram of an extended turbo decoder according to disclosed embodiments of the present invention. As shown in FIG. 1, the extended turbo decoder 100 includes a first maximum a-posteriori probability (MAP) decoder 110, a first interleaver 120, a second interleaver 130, a second MAP decoder 140, a de-interleaver 150, a summer 160, a hard decoding circuit 170, and a parity bit log-likelihood ratio (LLR) circuit 180. This circuit performs the operations noted above.

The first MAP decoder 110 receives input systematic bit LLR values, first input parity bit LLR values, and de-interleaved a-priori LLR values from the de-interleaver 150, and uses these values in a MAP decoding operation to generate first extrinsic LLR values.

The first interleaver 120 receives the first extrinsic LLR values, performs an interleaving operation on it, and passes it to the second map decoder 140 as second a-priori LLR values.

The second interleaver 130 receives the input systematic bit LLR values, performs an interleaving operation on it, and passes it to the second map decoder 140 as interleaved systematic bit LLR values.

The second MAP decoder 140 receives as an input the second input parity bit LLR values, the second a-priori LLR values, and the interleaved systematic bit LLR values, and uses these values in a MAP decoding operation to generate second extrinsic LLR values.

The de-interleaver 150 receives the second extrinsic LLR values, and performs a de-interleaving process to generate first a-priori LLR values.

The summer 160 adds the first a-priori LLR values, the first extrinsic LLR values, and the input systematic bit LLR values to provide output systematic (i.e., information) bit LLR values. This value is sent to the hard decoding circuit 170 and is also fed back to the receiver circuitry that generated the input LLR values.

The hard decoding circuit 170 performed a hard decoding operation on the output systematic bit LLR values to generate hard decoded bits that provide a prediction of the transmitted data bits.

The parity bit LLR circuit 180 calculates output parity bit LLR values based on the input systematic and parity LLR values and the output systematic bit LLR values, using multiple decoding operations (e.g., BCJR decoding operations). Details regarding exactly how these operations may be implemented are shown below.

The first and second interleavers 120 and 130, and the de-interleaver can operate using any appropriate interleaving operation. This can include, but should not be limited to: random interleaving, block interleaving, diagonal interleaving, and circular-shift interleaving. A variety of interleaving sizes can be used in various embodiments.

The output systematic bit LLR values and the output first and second parity LLR values are used in a feedback receiver circuit to control the operation of a channel equalizer or a channel decoder to improve the accuracy of the decoding operation. In some embodiments a subtraction operation can be performed on the input/output LLR values to ensure that either of the cooperating blocks (channel equalizer and channel decoder) can treat the feedback coming from the other block as a-priori information.

Figure 2:
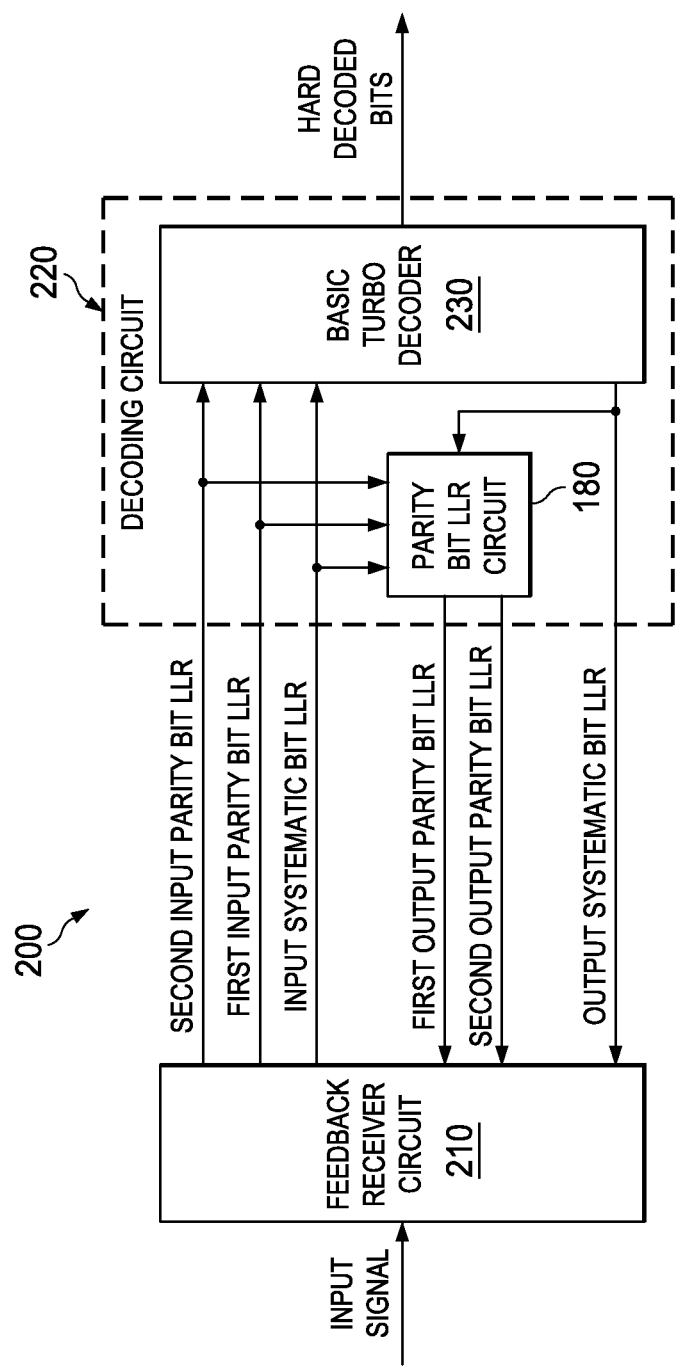
FIG. 2 is a diagram of an exemplary receiver circuit using the turbo decoder of FIG. 1, according to disclosed embodiments of the present invention.

FIG. 2 is a diagram of a receiver circuit using the turbo decoder of FIG. 1, according to disclosed embodiments of the present invention. As shown in FIG. 2, the receiver circuit 200 includes a feedback receiver circuit 210 and a decoding circuit 220. The decoding circuit 220 includes a basic turbo decoding circuit 230 and a parity bit LLR circuit 180, as shown in FIG. 1.

The feedback receiver circuit 210 receives an input signal, and from this input signal generates initial LLR values for systematic (i.e., informational) bits and parity bits that it sends to the decoding circuit 220 (e.g., the input systematic bit LLR values, the input first parity bit LLR values, and the input second parity bit LLR values in FIG. 2). The generation of these values can take place in such circuitry as a channel equalizer, and the like. The feedback receiver circuit 210, in turn, receives LLR values for systematic bits and parity bits that are fed back from the decoding circuit 220 (e.g., the output systematic bit LLR values, the output first parity bit LLR values, and the output second parity bit LLR values in FIG. 2). Once it receives these feedback LLR values, the feedback receiver circuit 210 generates revised LLR values for systematic (i.e., informational) bits and parity bits based on the input signal and the feedback LLR values.

The decoding circuit 220 in this embodiment operates like the extended turbo decoder 100 described above with respect to FIG. 1. However, in this disclosed embodiment, the parity bit LLR circuit 180 is separate from the basic turbo decoding circuit 230.

The basic turbo decoding circuit 230 performs a turbo decoding operation as described above, except it only calculates output systematic bit LLR values and hard decoded bits.

The parity bit LLR circuit 180 calculates output parity bit LLR values based on the input systematic and parity LLR values and the output systematic bit LLR values, using a decoding operation (e.g., a BCJR decoding operation).

In some embodiments, the basic turbo decoding circuit 230 and the parity bit LLR circuit 180 will be physically separate elements, e.g., different integrated circuits. By connecting a separate parity bit LLR circuit 180 to a basic turbo decoding circuit 230, such embodiments allows for the flexibility of allowing basic turbo decoding circuits to be upgraded into turbo decoding circuits that operate in accordance with the disclosed embodiments. In such cases, the parity bit LLR circuit 180 serves as a computational block outside of the basic turbo decoding circuit 230, which calculates the parity bit LLR values using the input systematic and parity LLR values and the output systematic bit LLR values.

In addition, some embodiments (e.g., a receiver using the 3GPP standard) may subtract corresponding input LLR values from corresponding output LLR values prior to them being used by the feedback receiver circuit 210. This operation could be performed in the feedback receiver circuit 210, in the decoding circuit 220, or in a separate element between these two circuits.

Parity Bit LLR Calculation

Figure 3:
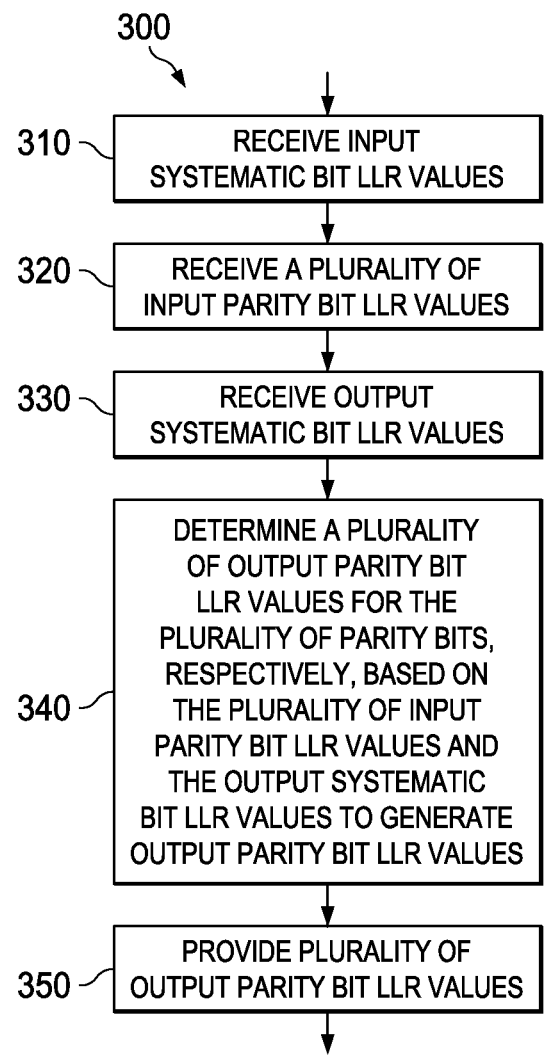
FIG. 3 is a flow chart showing a method for determining parity bit soft information at a decoder output according to disclosed embodiments.

FIG. 3 is a flow chart showing a method for determining parity bit soft information at a decoder output according to disclosed embodiments. In this disclosed embodiment LLR values for the parity bits are used as the soft information, by way of example. However, in alternate embodiments, other types of soft information regarding the parity bits can be used.

As shown in FIG. 3, the operation of determining parity bit soft information 300 begins when a soft information calculator receives an input systematic bit LLR values (310), receives a plurality of input parity bit LLR values (320), and receives an output systematic bit LLR values.

The input systematic bit LLR values and the plurality of input parity bit LLR values are provided for a decoding operation (e.g., a turbo decoding operation); and the output systematic bit LLR values are received based on the results of the decoding operation. (330) The number of input parity bit LLR values may vary in different embodiments.

Once it has received the input systematic bit LLR values, the plurality of input parity bits LLR values, and the output systematic bit LLR values, the operation continues by performing a series of signal processing operations for each of the plurality of parity bits based on the plurality of input parity bits LLR values and the output systematic bit LLR values to determine a plurality of output parity bit LLR values for the plurality of parity bits, respectively. (340) In alternate embodiments, this operation could also calculate the plurality of output parity bit LLR values based in part on the input systematic bit LLR values.

These LLR values can be provided as output signals (350) to a feedback receiver, a channel equalizer, or the like.

Parity Bit LLR Computation for Binary Systematic Turbo Code

As noted above, the parity bit LLR circuit 180 and an associated decoding operation provide output parity bit LLR values to be fed back to a feedback receiver circuit 210. The following description illustrates how such a process can be performed in association with or a binary systematic turbo code.

Figure 4:
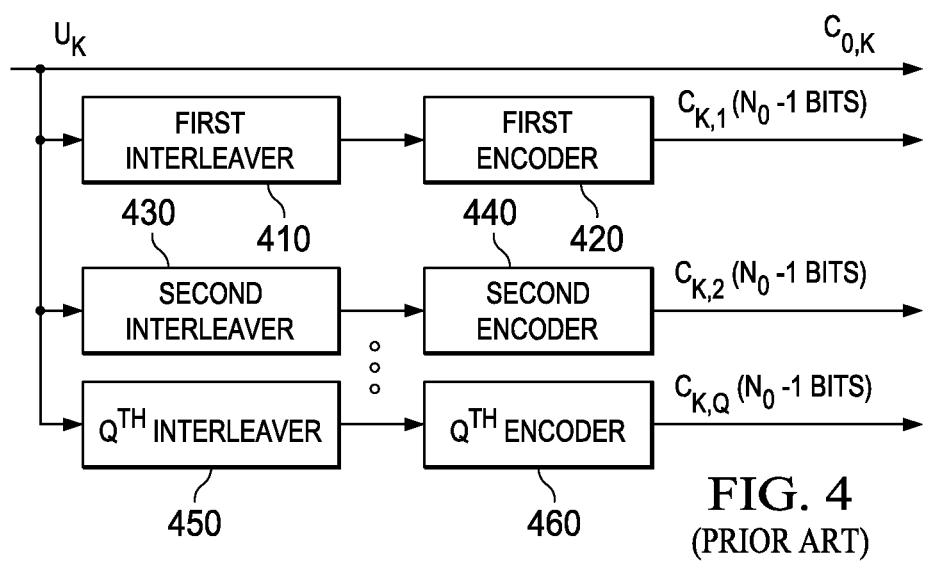
FIG. 4 is a diagram showing a turbo encoder for a binary systematic turbo code according to disclosed embodiments.

In order to understand the decoding operation, however, it is first necessary to understand the encoding operation. FIG. 4 is a diagram showing a conventional turbo encoder for a binary systematic turbo code according to disclosed embodiments. As shown in FIG. 4, an input signal $u_k$ is provided to first, second, ..., and $Q^{th}$ interleavers 410, 430, ... 450, and is processed to form a systematic bit $c_k$. The outputs of the interleavers 410, 430, ... 450 are provided to corresponding first, second, ..., $Q^{th}$ encoders 420, 440, ... 460, which are each used to generate parity bits $c_{k,1}$ (i.e., $n_0-1$ bits).

The first, second, ..., and $Q^{th}$ interleavers 410, 430, ... 450 can operate using any appropriate interleaving operation. This can include, but should not be limited to: random interleaving, block interleaving, diagonal interleaving, and circular-shift interleaving. A variety of interleaving sizes can be used in various embodiments. In some embodiments, the first interleaver 410 may be bypassed.

In this embodiment, the number of code bits $n_0$ generated for each input bit $u_k$ may be different for each component code. This number represents one systematic bit plus $n_0-1$ parity bits.

In order to determine the parity bit LLR values on the decoder side for this generic binary case the decoding method (e.g., a BCJR method) needs to be run Q times (i.e., once per constituent encoder). Each iteration will generate $K \times (n_0-1)$ parity bit LLR values, where K is the number of information bits in a block.

The details of the BCJR method, which is shown by way of example for computing the forward metrics ($\alpha$), backward metrics ($\beta$) and transitional probabilities ($\gamma$), are as follows:

Where $k=1, 2, \ldots, K$, the following values are used: $\Lambda_{0,k}^c$ is a channel LLR value for a systematic bit $c_{0,k}$ ($u_k$) at the turbo decoder input (e.g., the input systematic bit LLR values of FIGS. 1 and 2); $\Lambda_{j,k}^c$ is a channel LLR for parity bits $c_{j,k}$, $j=1, 2, \ldots, n_0-1$ at the turbo decoder input (e.g., the first and second input parity bit LLR values of FIGS. 1 and 2); and $\Lambda_{0,k}$ is an LLR value for the systematic bit $c_{0,k}$ ($u_k$) at the turbo decoder output (e.g., the output systematic bit LLR values of FIGS. 1 and 2).

It is necessary, therefore, to use this information to determine the parity bit $c_{j,k}$ LLR values (e.g., the first and second output parity bit LLR values of FIGS. 1 and 2), as follows:

$$\Lambda_{j,k} = \ln \frac{Pr\{c_{j,k} = 1 \mid Y_1^n\}}{Pr\{c_{j,k} = 0 \mid Y_1^n\}}, \text{ for } j = 1, 2, \ldots, n_0 - 1, \quad (4)$$

and $$k = 1, 2, \ldots, K.$$

The BCJR method provides the following equation:

$$\Lambda_{j,k} = \ln \frac{Pr\{c_{j,k} = 1 \mid Y_1^n\}}{Pr\{c_{j,k} = 0 \mid Y_1^n\}} = \ln \frac{\sum_{\{(s',s):c_{j,k}=1\}} \alpha_{k-1}(s')\beta_k(s)\gamma_k(s',s)}{\sum_{\{(s',s):c_{j,k}=0\}} \alpha_{k-1}(s')\beta_k(s)\gamma_k(s',s)}, \quad (5)$$

where the trellis state at time k is $S_k$, the symbol s' is the trellis state at time k−1, and s is the trellis state at time k.

Based on this, it is possible to determine that $\{(s',s):c_{j,k}=1\}$ is the set of trellis state transitions from $S_{k-1}=s'$ to $S_k=s$ with $c_{j,k}=1$. Likewise, $\{(s',s):c_{j,k}0=\}$ is the set of trellis state transitions from $S_{k-1}=s'$ to $S_k=s$ with $c_{j,k}=0$.

The BCJR method also allows for recursively calculating forward probabilities, $\alpha_k(s)$, and backward probabilities, $\beta_k(s)$ according to the following equations:

$$\alpha_k(s) = \sum_{s'=0}^{S-1} \alpha_{k-1}(s')\gamma_k(s', s), \quad k = 1, 2, \ldots, K-1, \text{ and} \qquad (6)$$

$$\beta_k(s) = \sum_{s'=0}^{S-1} \beta_{k+1}(s')\gamma_{k+1}(s', s), \quad k = K-1, \ldots, 2, 1, \qquad (7)$$

where S is the number of states for the constituent convolutional code. The forward and backward probabilities $\alpha$ and $\beta$ can also be called forward and backward metrics $\alpha$ and $\beta$.

The transitional probabilities ($\gamma$) (also called a branch metric) can then be determined using the available inputs according to the following equation:

$$\gamma_k(s', s) = Pr\{S_k = s, y_k \mid S_{k-1} = s'\} \qquad (8)$$

$$= \sum_{c_{0,k}=0}^{1} Pr\{y_k \mid c_k\} Pr\left\{\begin{array}{l} c_{0,k} \mid S_k = s, \\ S_{k-1} = s' \end{array}\right\} Pr\{S_k = s \mid S_{k-1} = s'\}$$

where $c_k = \{c_{0,k}, c_{1,k}, \ldots, c_{n_0-1,k}\}$ is the constituent encoder output associated with trellis state transition (s', s), and $y_k = \{y_{0,k}, y_{1,k}, \ldots, y_{n_0-1,k}\}$ is the receive sample set carrying $c_k$. Each trellis state transition has a systematic bit value ($c_{0,k}=0$ or 1) associated with it. In addition, there is also a one-to-one mapping of the values of a particular parity bit $c_{j,k}$ corresponding to the systematic bit values. Therefore, a conventional manner of computing $\gamma$, associated with the systematic bit values being 0 or 1 can be used.

In equation (8), the term $Pr\{S_k=s|S_{k-1}=s'\}$ represents any available a-priori knowledge about any bits participating in the (s', s) transition, systematic or parity. The turbo decoder systematic bit LLR value is used to extract this a-priori information. This allows $\gamma$ to be written more compactly as:

$$\gamma_k^i(s', s) = \begin{cases} Pr\{y_k \mid c_k\}Pr\{c_{0,k} = i\} & \text{if } \{(s', s) : c_{0,k} = i\}, \; i = 0, 1 \\ 0 & \text{otherwise} \end{cases} \qquad (9)$$

The a-priori probability $Pr\{c_{0,k}=i\}$ can be represented in terms of the a-priori LLR value for the systematic bit, $c_{0,k}$, which is defined as:

$$\Lambda_{0,k}^a = \ln \frac{Pr\{c_{0,k}=1\}}{Pr\{c_{0,k}=0\}} = \ln \frac{Pr\{u_k=1\}}{Pr\{u_k=0\}}, \quad k = 1, 2, \ldots, K \qquad (10)$$

The value $Pr\{c_{0,k}=i\}$ can be determined as follows:

$$Pr\{c_{0,k} = i\} = \frac{e^{\Lambda_{0,k}^a/2}}{1+e^{\Lambda_{0,k}^a/2}} e^{(2i-1)\Lambda_{0,k}^a/2} \qquad (11)$$

If this particular calculation operation is used, the first factor can be omitted altogether since it does not depend on the value of the systematic bit, i, and cancels out in the ratio in Equation (5). Similarly, after applying similar reasoning to the conditional probability term, $Pr\{y_k|c_k\}$, the calculation of $\gamma$ can be simplified as:

$$\gamma_k^i(s', s) = e^{(2i-1)\Lambda_{0,k}^a/2} e^{\sum_{j=0}^{n_0-1}(2c_{j,k}^i-1)\Lambda_{j,k}^c/2} \qquad (12)$$

At this point it is more convenient to switch to the equivalent log-domain. Therefore, the logarithms of $\alpha$, $\beta$, and $\gamma$ are used: $\bar{\alpha}_k(s)=\ln \alpha_k(s)$, $\bar{\beta}_k(s)=\ln \beta_k(s)$, and $\bar{\gamma}_k(s', s)=\ln \gamma_k(s', s)$. For ease of disclosure, the overbar on top of these characters will be omitted.

As a result of this, the calculation of $\gamma$ is done as follows:

$$\gamma_k^i(s', s) = (2i-1)\frac{\Lambda_{0,k}^a}{2} + (2i-1)\frac{\Lambda_{0,k}^c}{2} + \sum_{j=1}^{n_0-1}(2c_{j,k}^i-1)\frac{\Lambda_{j,k}^c}{2}, \qquad (13)$$

where $k=1, 2, \ldots, K$, $j=1, 2, \ldots, n_0-1$, $i=u_k(0$ or $1)$ and $c_{j,k}^i$ is the parity bit corresponding to (s', s) caused by $u_k=i$.

As seen above with respect to FIG. 1, $\Lambda_{0,k}$, the turbo decoder output systematic bit LLR value, is made up of several components: the extrinsic information from all constituent MAP decoders and the input systematic bit LLR value, $\Lambda_{0,k}^c$ (i.e., the channel LLR value). Since the input systematic bit LLR value, $\Lambda_{0,k}^c$, also appears in equation (13) it has to be removed from $\Lambda_{0,k}$ in order for it to serve as an a-priori information related to the (s', s) transition:

$$\Lambda_{0,k}^a = \Lambda_{0,k} - \Lambda_{0,k}^c.$$

Therefore, by combining this with equation (13) the following is shown:

$$\gamma_k^i(s', s) = (2i-1)\frac{\Lambda_{0,k}}{2} + \sum_{j=1}^{n_0-1}(2c_{j,k}^i-1)\frac{\Lambda_{j,k}^c}{2} \qquad (14)$$

As a result, the whole operation in the log-domain can be summarized as follows (for $k=1, 2, \ldots, K$). $\Lambda_{j,k}^c$ is a channel LLR value for parity bits $c_{j,k}$, $j=1, 2, \ldots, n_0-1$, at the turbo decoder input; and $\Lambda_{0,k}$ is the LLR value for the systematic bit $c_{0,k}(u_k)$ at the turbo decoder output.

Values for $\alpha$ and $\beta$ can then be initialized as follows:

$$\alpha_0(s)=\alpha_{init}(s), s=0,1,\ldots,S-1 \qquad (15)$$

$$\beta_K(s)=\beta_{init}(s), s=0,1,\ldots,S-1 \qquad (16)$$

It is then possible to compute branch metrics according to the following equation:

$$\gamma_k^i(s', s) = (2i-1)\frac{\Lambda_{0,k}}{2} + \sum_{j=1}^{n_0-1}(2c_{j,k}^i-1)\frac{\Lambda_{j,k}^c}{2}, \qquad (17)$$

$$k = 1, 2, \ldots, K$$

It is possible to compute forward and backward metrics according to the following equations:

$$\alpha_k(s)=\ln [e^{\alpha_{k-1}^0(s')+\gamma_k^0(s',s)}+e^{\alpha_{k-1}^1(s')+\gamma_k^1(s',s)}], k=1,2,\ldots,K-1 \qquad (18)$$

$$\beta_k(s)=\ln [e^{\beta_{k+1}^0(s')+\gamma_{k+1}^0(s',s)}+e^{\beta_{k-1}^1(s')+\gamma_{k+1}^1(s',s)}], k=K-1,\ldots,2,1, \qquad (19)$$

where superscript i=0,1 indicates the value of the corresponding systematic bit.

And it is possible to compute soft bit information (LLR values) for parity bits according to the following equation:

$$\Lambda_{j,k} = \ln \sum_{\{(s_{k-1},s_k): c_{j,k}=1\}} e^{\alpha_{k-1}(s')+\beta_k(s)+\gamma_k(s',s)} - \ln \sum_{\{(s_{k-1},s_k): c_{j,k}=0\}} e^{\alpha_{k-1}(s')+\beta_k(s)\gamma_k(s',s)}, \quad (20)$$

for k=1, 2, . . . , K, j=1, 2, . . . , $n_0$−1.

This method for the parity bit LLR value computation can be used in conjunction with any techniques that allow simplified computations of the terms $$\ln \sum_m e^{xm}.$$

For example, Max-Log-MAP, Max-Log-MAP with corrective factor, iterative Jacobi method, or any other suitable method can all be used.

The precise initialization of the α and β metrics will depend on the particular design of the constituent convolutional encoders (e.g., fixed known initial and end state, circular-"tail-biting", fixed initial and unknown ending state, etc.) and the details of the overall system employing particular turbo code.

One exemplary embodiment, however, is for use with 3GPP turbo codes. In this embodiment, the codes are initiated from the state zero and are forced back to the state zero by sending additional data for each of the component encoders. The initialization of α and β in this embodiment are specified as follows:

$$\alpha_0(s) = \begin{cases} 0 & \text{for } s = 0 \\ \text{Large negative number} & \text{for } s \neq 0 (s = 1, 2, \ldots, S-1) \end{cases} \quad (21)$$

$$\beta_K(s) = \beta_{tt\_init}(s), s=0,1,\ldots,S-1, \text{ where } \beta_{tt\_init}(s) \quad (22)$$

These are pre-computed backward metrics. This computation depends on the particular trellis termination pattern.

Parity Bit LLR Calculation Using Trellis Termination Bits

In some embodiments, it may be required to provide the soft information (bit LLR values) for the trellis termination bits in addition to the bit LLR values for the systematic and the parity bits.

Figure 5:
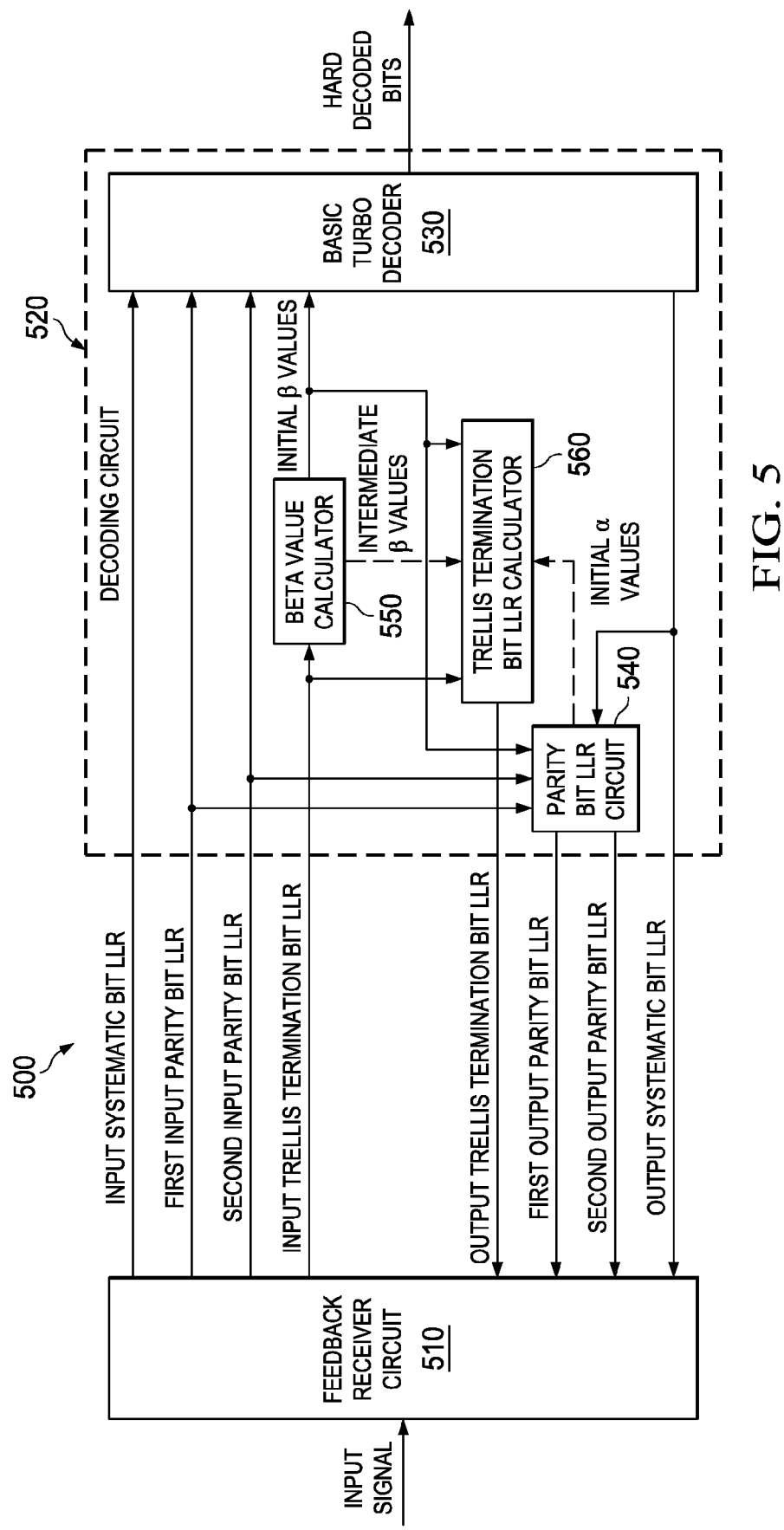
FIG. 5 is a diagram of an exemplary receiver circuit using an alternate turbo decoder according to disclosed embodiments of the present invention.

FIG. 5 is a diagram of a receiver circuit using an alternate turbo decoder according to disclosed embodiments of the present invention. As shown in FIG. 5, the receiver circuit 500 includes a feedback receiver circuit 510 and a decoding circuit 520. The decoding circuit 520 includes a basic turbo decoding circuit 530, a parity bit LLR circuit 540, an initial beta value calculator 550, and a trellis termination bit LLR calculator 560.

The feedback receiver circuit 510 receives an input signal, and from this input signal generates initial LLR values for systematic (i.e., informational) bits, parity bits, and a trellis termination bit that it sends to the decoding circuit 520 (e.g., the input systematic bit LLR values, the input first parity bit LLR values, the input second parity bit LLR values, and the input trellis termination bit LLR values in FIG. 5). The generation of these values can take place in such circuitry as a channel equalizer, and the like. The feedback receiver circuit 510, in turn, receives LLR values for systematic bits, parity bits, and trellis termination bits that are fed back from the turbo decoder 520 (e.g., the output systematic bit LLR values, the output first parity bit LLR values, the output second parity bit LLR values, and the output trellis termination bit LLR values in FIG. 5). Once it receives these feedback LLR values, the feedback receiver circuit 510 generates revised LLR values for systematic (i.e., informational) bits and parity bits based on the input signal and the feedback LLR values.

The decoding circuit 520 operates similarly to the decoding circuit of FIG. 2, except that the parity bit LLR circuit 540 operates based on slightly different input signals than the parity bit LLR circuit 180 on the decoding circuit 220. In particular, in this embodiment, it operates on LLR values for parity bits and trellis termination bits input to the basic turbo decoder 530, an LLR values for systematic (i.e., informational) bits output from the basic turbo decoder 530, and initial β values determined by the initial beta value calculator 550.

The basic turbo decoding circuit 530 performs a turbo decoding operation similar to the basic turbo decoder 230 described above with respect to FIG. 2. However, in addition to the input signals received by the basic turbo decoder 230 of FIG. 2, the basic turbo decoder 530 of FIG. 5 also receives the initial β values determined by the initial beta value calculator 550.

The parity bit LLR circuit 540 operates in a manner similar to the parity bit LLR circuit 180 of FIGS. 1 and 2, except that it calculates output parity bit LLR values based on the input parity LLR values, the initial β values output by the beta value calculator 550, and the output systematic bit LLR values, using a decoding operation (e.g., a BCJR decoding operation).

The beta value calculator 550 serves as an initial backward metric calculator, and receives the input trellis termination bit LLR values and uses this to generate the initial β values (i.e., initial backward metrics). In alternate embodiments, the beta value calculator 550 can also output intermediate β values that represent trellis values obtained prior to determining final values for the initial β values. These can be used by the trellis termination bit LLR calculator 560 to avoid the need to duplicate circuitry.

In an associated transmitter, each of a plurality of constituent encoder trellises (not shown) are driven to a known state (typically a zero state) by sending additional "trellis termination" bits which effectively expand a trellis state transition diagram by $\log_2$ (S) trellis stages. Computation of bit LLR values for the "systematic" trellis termination bits is performed by applying regular decoding operations (e.g., the BCJR method) without any a-priori information available from the turbo decoder.

The trellis termination bit LLR calculator 560 operates as a soft information value calculator, and receives the input trellis termination bit LLR values and initial β values from the beta value calculator 550, and uses these to calculate output trellis termination bit LLR values. Trellis termination bit LLR values may be determined, as described above, without any a-priori information available from the turbo decoder. However, as noted, very reliable initial α metric values can be obtained according to Equation (18) above for k=K. This is indicated by the dashed line going from the parity bit LLR circuit 540 to the trellis termination bit LLR calculator 560. In addition, very reliable intermediate β metric values can be obtained through the pre-computation which is normally a part of the regular backward metric initialization process in a typical turbo decoder operation. This is indicated by the dashed line going from the beta value calculator 550 to the trellis termination bit LLR calculator 560.

Thus, in some embodiments, the trellis termination bit LLR calculator 560 can receive intermediate β values from the beta value calculator 550. These intermediate β values can be used in the calculation of the output trellis termination bit LLR values, avoiding the need to duplicate circuitry already present in the initial beta value calculator. Alternatively, all of the required circuitry could be included in the trellis termination bit LLR calculator 560, and taps can be made where necessary to output the initial β values. In such an embodiment, the trellis termination bit LLR calculator 560 will provide the initial β values to the basic turbo decoder 530 and the parity bit LLR circuit 540.

Furthermore, in some embodiments, the trellis termination bit LLR calculator 560 will assume that a constant initial α value (i.e., forward metrics) will be used. This will reduce the accuracy of the trellis termination bit LLR determination, but will simplify the circuit.

In addition, some embodiments (e.g., a receiver using the 3GPP standard) may subtract corresponding input LLR values from corresponding output LLR values prior to them being used by the feedback receiver circuit 510. This operation could be performed in the feedback receiver circuit 510, in the decoding circuit 520, or in a separate element between these two circuits.

Alternate Parity Bit LLR Computation

Figure 6:
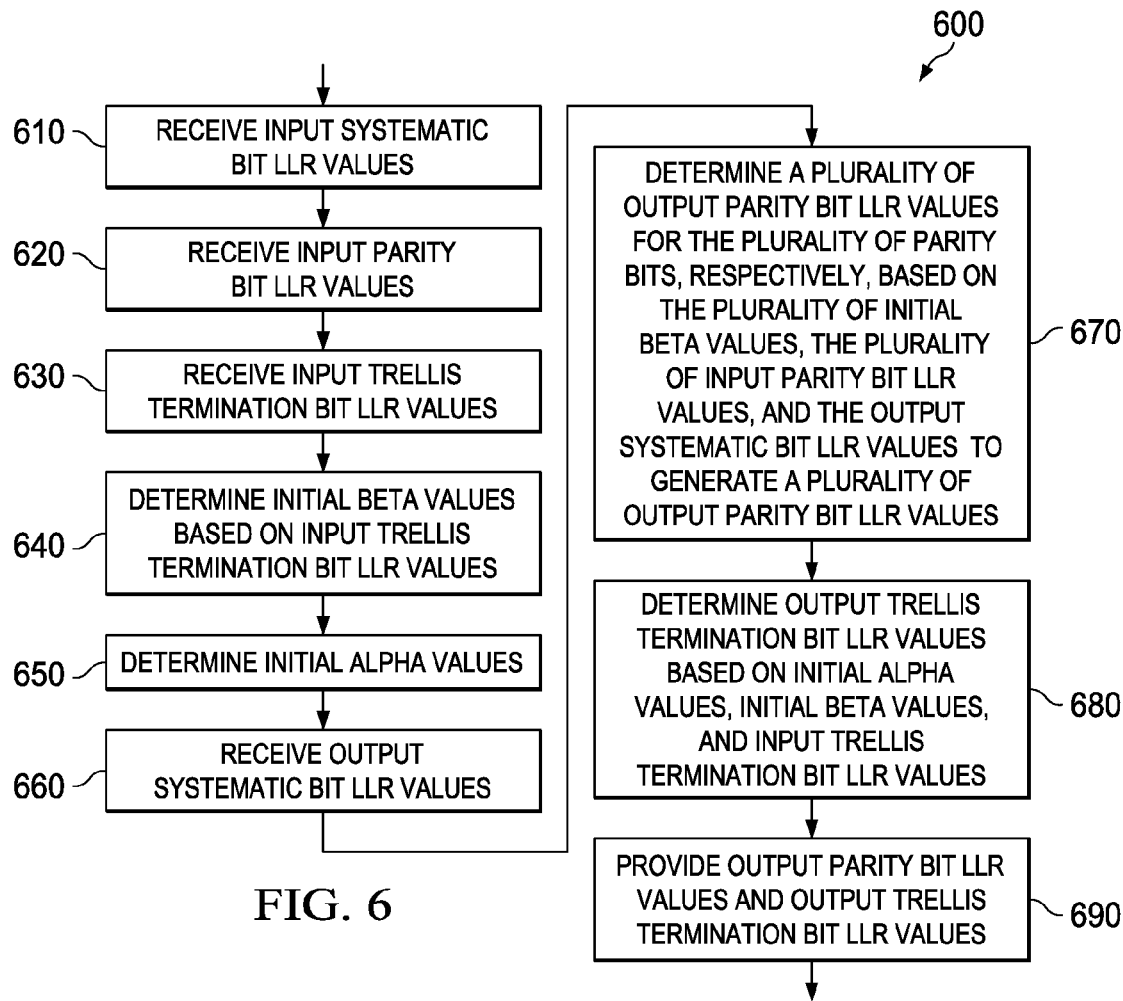
FIG. 6 is a flow chart showing an alternate turbo decoding operation according to disclosed embodiments.

FIG. 6 is a flow chart showing an alternate method for determining parity bit soft information at a decoder output according to disclosed embodiments. In this disclosed embodiment LLR values for the parity bits are used as the soft information, by way of example. However, in alternate embodiments, other types of soft information regarding the parity bits can be used.

As shown in FIG. 6, the operation of determining parity bit soft information 600 begins when a soft information calculator receives a plurality of input systematic bit LLR values (610), receives a plurality of input parity bit LLR values (620), and receives a plurality of input trellis termination bit LLR values (630). The number of input parity bit LLR values may vary in different embodiments.

The input trellis termination bit LLR value is then used to generate initial β values (i.e., initial backward metrics), which will be used for decoding and determining parity bit soft information. (640)

The operation also generates a plurality of initial α values (i.e., initial forward metrics). (650) These initial α values can vary based on a variety of input values, or could be constant based on system parameters.

The plurality of input parity bit LLR values and the initial β values (along with input systematic bit LLR values) are provided for a decoding operation (e.g., a turbo decoding operation). This decoding operation will generate a plurality of output systematic bit LLR values, which is received based on the results of the decoding operation. (660)

The operation then performs a plurality of signal processing operations based on the initial β values, the plurality of input parity bits LLR values, and the output systematic bit LLR values to determine a plurality of output parity bit LLR values for each of the plurality of parity bits, respectively. (670)

The operation then determines output trellis termination bit LLR values based on the initial β values, the initial α values, and the input trellis termination bit LLR values. (680)

All of the output parity bit LLR values and the output trellis termination bit LLR values are then provided as output signals. (690) These LLR values can be provided to a feedback receiver, a channel equalizer, or the like.

Parity Bit LLR Computation for Non-Binary Systematic Turbo Code

As noted above, the parity bit LLR circuit 540 and an associated decoding operation provide output parity bit LLR values to be fed back to a feedback receiver circuit 510. The following description illustrates how such a process can be performed in association with a non-binary systematic turbo code.

Figure 7:
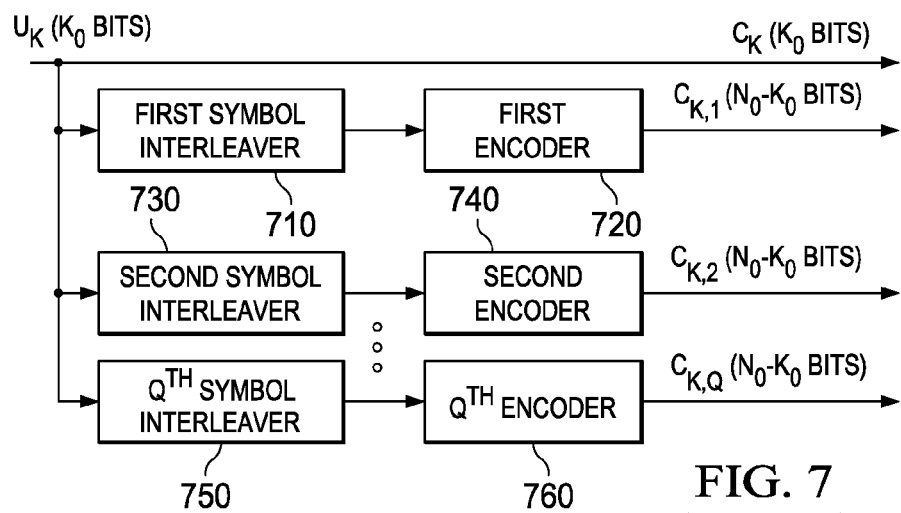
FIG. 7 is a diagram showing a turbo encoder for a non-binary systematic turbo code according to disclosed embodiments.

In order to understand the decoding operation, however, it is first necessary to understand the encoding operation. FIG. 7 is a diagram showing a turbo encoder for a non-binary systematic turbo code according to disclosed embodiments. As shown in FIG. 7, an input signal $u_k$ is provided to first, second, . . . , and $Q^{th}$ symbol interleavers 710, 730, . . . 750, and is passed as a systematic bit $c_k$. The outputs of the symbol interleavers 710, 730, . . . 750 are provided to corresponding first, second, . . . , $Q^{th}$ encoders 720, 740, . . . 760, which are each used to generate parity bits $c_{k,1}$ (i.e., $n_0-1$ bits).

The first, second, . . . , and $Q^{th}$ symbol interleavers 710, 730, . . . 750 can operate using any appropriate interleaving operation. This can include, but should not be limited to: random interleaving, block interleaving, etc. A variety of interleaving sizes can be used in various embodiments. In some embodiments, the first symbol interleaver 710 may be bypassed.

Each constituent encoder 720, 740, . . . 760 is a $(n_0,k_0)$ convolutional encoder. The number of code bits, $n_0$ ($k_0$ systematic bits plus $n_0-k_0$ parity bits) generated per $k_0$ input bits, $u_k=\{u_{0,k}, u_{1,k}, \ldots, u_{k_0-1,k}\}$, may be different for each component code. Each $k_0$ input bits constitute a systematic symbol, i, which can take one of M values from the range i=0, 1, . . . , M−1 (M=$2^{k_0}$). Each $n_0-k_0$ output bits constitute a parity symbol, $i_p$, which can take one of $M_p$ values from the range $i_p$=0, 1, . . . , $M_p-1$ ($M_p=2^{n_0-k_0}$). The symbol interleavers in FIG. 7 may also include the intra-symbol bit shuffling.

In order to compute the parity bit LLR values on the decoder side for this non-binary case the decoding operation (e.g., a BCJR method) needs to be run Q times (i.e., once per constituent encoder). Each calculation generates K×($n_0-k_0$) parity bit LLR values, where K is the number of information non-binary symbols in a block.

The exemplary BCJR method is used in a similar fashion as in the case of the binary turbo codes described in the previous section.

Assuming that k=1, 2, . . . , K: $\Lambda_{j,k}^c$ is a channel LLR value for the systematic bits $c_{j,k}$ ($u_{j,k}$), j=0, 1, . . . , $k_0-1$ at the turbo decoder input; $\Lambda_{j,k}^c$ is a channel LLR value for the parity bits $c_{j,k}$, j=$k_0$, . . . , $n_0-1$ at the turbo decoder input; $\Lambda_{j,k}$ is an LLR value for the systematic bits $c_{j,k}$ ($u_{j,k}$), j=0, 1, . . . , $k_0-1$ at the turbo decoder output.

It is necessary, therefore, to use this information to determine the parity bit $c_{j,k}$ LLR values (e.g., the first and second output parity bit LLR values of FIGS. 1 and 2), as follows:

$$\Lambda_{j,k} = \ln \frac{Pr\{c_{j,k} = 1 \mid Y_1^n\}}{Pr\{c_{j,k} = 0 \mid Y_1^n\}} \text{ for } j = k_0, \ldots, n_0-1, \quad (23)$$

$$\text{and } k = 1, 2, \ldots, K$$

The key contribution here, as in the case of the binary turbo codes described in the previous section, is in the way the a-priori portion of the transitional metrics γ is set. Namely, in the case of the non-binary turbo codes γ is computed as follows:

$$\gamma_k^i(s', s) = L_k^a(i) + \sum_{j=0}^{k_0-1} (2c_{j,k}^i - 1)\frac{\Lambda_{j,k}^c}{2} + \sum_{j=k_0}^{n_0-1} (2c_{j,k}^i - 1)\frac{\Lambda_{j,k}^c}{2}, \quad (24)$$

for k=1, 2, . . . , K, i=0, 1, . . . , M−1, where $L_k^a(i)$ is any a-priori information available about symbol i. This a-priori information is initialized using the systematic bit LLRs at the output of the turbo decoder as follows:

$$L_k^a(i) = \sum_{j=0}^{k_0-1} (2c_{j,k}^i - 1)\frac{\Lambda_{j,k}}{2} - \sum_{j=0}^{k_0-1} (2c_{j,k}^i - 1)\frac{\Lambda_{j,k}^c}{2}, \quad (25)$$

for k=1, 2, . . . , K, i=0, 1, . . . , M−1.

The quantity $$\sum_{j=0}^{k_0-1} (2c_{j,k}^i - 1)\frac{\Lambda_{j,k}^c}{2}$$

(i.e., systematic bit channel LLR values) may be subtracted out from the turbo decoder generated systematic bit LLR values quantity since it already appears in Equation (24). This ensures that $L_k^a(i)$ can serve as true a-priori information related to the (s', s) transition. The final formula for γ is thus:

$$\gamma_k^i(s', s) = \sum_{j=0}^{k_0-1} (2c_{j,k}^i - 1)\frac{\Lambda_{j,k}}{2} + \sum_{j=k_0}^{n_0-1} (2c_{j,k}^i - 1)\frac{\Lambda_{j,k}^c}{2}, \quad (26)$$

for k=1, 2, . . . , K, i=0, 1, . . . , M−1.

If everything is moved into the log-domain, it can be summarized as follows:

Assuming k=1, 2, . . . , K: $\Lambda_{j,k}^c$ is a channel LLR for the parity bits $c_{j,k}$, j=$k_0$, . . . , $n_0$−1 at the turbo decoder input; and $\Lambda_{j,k}$ is an LLR value for the systematic bits $c_{j,k}(u_k)$, j=0, 1, . . . , $k_0$−1 at the turbo decoder output.

Initial values for α and β can be determined by the following equations:

$$\alpha_0(s) = \alpha_{init}(s), s=0, 1, . . . , S-1 \quad (27)$$

$$\beta_K(s) = \beta_{init}(s), s=0, 1, . . . , S-1 \quad (28)$$

It is then possible to compute branch metrics according to the following equation:

$$\gamma_k^i(s', s) = \sum_{j=0}^{k_0-1} (2c_{j,k}^i - 1)\frac{\Lambda_{j,k}}{2} + \sum_{j=k_0}^{n_0-1} (2c_{j,k}^i - 1)\frac{\Lambda_{j,k}^c}{2}, \quad (29)$$

for k=1, 2, . . . , K, i=0, 1, . . . , M−1.

It is possible to compute forward and backward metrics according to the following equations:

$$\alpha_k(s) = \ln \sum_{s'=0}^{S-1} e^{\alpha_{k-1}(s') + \gamma_k(s', s)}, \text{ and} \quad (30)$$

$$\beta_k(s) = \ln \sum_{s'=0}^{S-1} e^{\beta_{k+1}(s') + \gamma_{k+1}(s, s')}, \quad (31)$$

for (k=1, 2, . . . , K, i=0, 1, . . . , M−1). Here, a symbol i is used for a particular state transition, (s', s)

And it is possible to compute Parity symbol $i_p$ log-likelihoods (where k=1, 2, . . . , K) according to the following equation:

$$L_k(i_p) = \ln \sum_{\{(s,s'):i_p\}} e^{\alpha_{k-1}(s') + \beta_k(s) + \gamma_k(s', s)} \quad (32)$$

In this equation corresponding state transitions, (s', s) are used for a particular parity symbol value, $i_p$. This set of state transitions is denoted by $\{(s', s): i_p\}$.

And it is possible to compute soft bit information (LLR values) for parity bits according to the following equation:

$$\Lambda_{j,k} = \ln\left(\sum_{\{i_p:c_{j,k}=1\}} e^{L_k(i_p)}\right) - \ln\left(\sum_{\{i_p:c_{j,k}=0\}} e^{L_k(i_p)}\right), \quad (33)$$

$$k = 1, 2, \ldots, K, j = k_0, \ldots, n_0 - 1$$

In this case, $\{i_p: c_{j,k}=1\}$ represents the set of values of the parity symbol $i_p$ in which bit $c_{j,k}=1$. Likewise, the set $\{i_p:c_{j,k}=0\}$ represents the set of values of the parity symbol $i_p$ in which bit $c_{j,k}=0$.

This operation for computing the parity bit LLR values can be used in conjunction with any techniques allowing simplified computations of the terms $$\ln \sum_m e^{x_m}.$$

For example, Max-Log-MAP, Max-Log-MAP with corrective factor, the iterative Jacobi method, or any suitable method can all be used.

The precise initialization of α and β metrics will depend on the particular design of the constituent convolutional encoders (e.g., fixed known initial and end state, circular-"tail-biting", fixed initial and unknown ending state, etc.) and overall system employing particular turbo code.

CONCLUSION

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A decoding circuit, comprising:
a turbo decoder configured to receive a plurality of input systematic bit soft information values and a plurality of input parity bit information values, and to generate a plurality of output systematic bit soft information values and a plurality of hard decoded bits according to a turbo decoding operation; and
a parity bit soft information generation circuit configured to receive the plurality of input systematic bit soft information values, the plurality of input parity bit soft information values, and the plurality of output systematic bit soft information values; to determine a plurality of initial forward metrics; to determine a plurality of initial backward metrics; to determine a plurality of branch metrics as a function of the plurality of input parity bit soft information values and the plurality of output systematic bit soft information values; to determine a plurality of output parity bit soft information values based on the branch metrics, the plurality of initial forward metrics, and the plurality of initial backward metrics; and to provide the plurality of output parity bit soft information values as a signal output.

2. The decoding circuit of claim 1, wherein the input systematic bit soft information is an input systematic bit log-likelihood-ratio value, the plurality of input parity bit soft information values are a plurality of parity bit log-likelihood-ratio values, the output systematic bit soft information value is an output systematic bit log-likelihood-ratio value, and the plurality of output parity bit soft information values are a plurality of output parity bit log-likelihood-ratio values, and wherein the parity bit soft information generation circuit is a log-likelihood-ratio circuit configured to generate the plurality of output parity bit log-likelihood-ratio values.

3. The decoding circuit of claim 1, wherein the parity bit soft information generation circuit is configured to generate the plurality of output parity bit soft information values using a Bahl-Cocke-Jelinek-Raviv method.

4. The decoding circuit of claim 1, wherein the turbo decoder is configured to employ binary turbo codes.

5. The decoding circuit of claim 1, wherein the turbo decoder is configured to employ non-binary turbo codes.

6. The decoding circuit of claim 1, wherein the turbo decoder and the parity bit soft information generation circuit are formed on separate integrated circuits.

7. A method for computing parity bit soft information, comprising:
receiving a plurality of input parity bit soft information values corresponding to a plurality of parity bits;
receiving a plurality of output systematic bit soft information values that are derived in part from the input systematic bit soft information value in a decoding operation;
determining a plurality of initial forward metrics and a plurality of initial backward metrics;
determining a plurality of branch metrics as a function of the plurality of input parity bit soft information values and the plurality of output systematic bit soft information values;
determining a plurality of output parity bit soft information values in a processor for the plurality of parity bits, respectively, based on the plurality of initial forward metrics, the plurality of initial backward metrics and the plurality of branch metrics; and
providing the plurality of output parity bit soft information values to a portion of a receiver circuit.

8. The method for computing parity bit soft information of claim 7, further comprising:
receiving a plurality of input trellis termination soft information values relating to an encoder that employs the plurality of parity bits;
determining a plurality of output trellis termination soft information values based on the plurality of initial forward metrics, the plurality of initial backward metrics, and the input trellis termination soft information value; and
providing the plurality of output trellis termination soft information values to the portion of the receiver circuit, wherein the plurality of initial backward metrics are determined based on the plurality of input trellis termination soft information values and characteristics of a related encoder.

9. The method for computing parity bit soft information of claim 8, wherein the initial forward metrics are set to a constant value.

10. The method for computing parity bit soft information of claim 7, wherein the input systematic bit soft information is an input systematic bit log-likelihood-ratio value, the plurality of input parity bit soft information values are a plurality of parity bit log-likelihood-ratio values, the output systematic bit soft information value is an output systematic bit log-likelihood-ratio value, and the plurality of output parity bit soft information values are a plurality of output parity bit log-likelihood-ratio values.

11. The method for computing parity bit soft information of claim 7, wherein the operation of determining the plurality of output parity bit soft information values is performed using a Bahl-Cocke-Jelinek-Raviv method.

12. The method for computing parity bit soft information of claim 7, wherein the decoding operation employs binary turbo codes.

13. The method for computing parity bit soft information of claim 7, wherein the decoding operation employs non-binary turbo codes.

14. The method for computing parity bit soft information of claim 7, wherein the decoding operation is a turbo decoding operation.

15. A decoding circuit, comprising:
a backward metric calculator configured to receive an input trellis termination soft information value relating to an encoder that employs a plurality of parity bits, and to generate a plurality of initial backward metrics;
a turbo decoder configured to receive an input systematic bit soft information value, a plurality of input parity bit information values, and the plurality of backward metrics, and to generate an output systematic bit soft information value and a hard decoded bit according to a turbo decoding operation;
a trellis termination soft information calculator configured to receive the input trellis termination soft information value and the plurality of initial backward metrics, and to generate an output trellis termination bit soft information value; and a parity bit soft information generation circuit configured to receive the plurality of backward metrics, the plurality of input parity bit soft information values, and the output systematic bit soft information value, to generate a plurality of initial forward metrics, to generate a plurality of branch metrics based on the plurality of input parity bit soft information values, and the output systematic bit soft information value; and to generate a plurality of output parity bit soft information values based on the plurality of initial forward metrics, the plurality of initial backward metrics, and the plurality of branch metrics.

16. The decoding circuit of claim 15, wherein the backward metric calculator is further configured to generate a plurality of intermediate backward metrics, and wherein the trellis termination soft information calculator is further configured to receive the plurality of intermediate backward metrics and to generate an output trellis termination bit soft information value based on the input trellis termination soft information value, the plurality of initial backward metrics, and the plurality of intermediate backward metrics.

17. The decoding circuit of claim 15, wherein the input systematic bit soft information is an input systematic bit log-likelihood-ratio value, the plurality of input parity bit soft information values are a plurality of parity bit log-likelihood-ratio values, the output systematic bit soft information value is an output systematic bit log-likelihood-ratio value, the plurality of output parity bit soft information values are a plurality of output parity bit log-likelihood-ratio values, and the input trellis termination soft information value is an input trellis termination log-likelihood-ratio value, and wherein the parity bit soft information generation circuit is a log-likelihood-ratio circuit configured to generate the plurality of output parity bit log-likelihood-ratio values.

18. The decoding circuit of claim 15, wherein the parity bit soft information generation circuit is configured to generate the plurality of output parity bit soft information values using a Bahl-Cocke-Jelinek-Raviv method.

19. The decoding circuit of claim 15, wherein the trellis termination bit soft information calculator is configured to generate the output trellis termination bit soft information value using a Bahl-Cocke-Jelinek-Raviv method.

20. The decoding circuit of claim 15, wherein the turbo decoder is configured to employ binary turbo codes.

21. The decoding circuit of claim 15, wherein the turbo decoder is configured to employ non-binary turbo codes.

22. The decoding circuit of claim 15, wherein the parity bit soft information generation circuit, the initial backward metric calculator, and the trellis termination bit soft information generator are each formed on a separate integrated circuit from the turbo decoder.

23. The decoding circuit of claim 15, further comprising:

a plurality of systematic subtractors configured to respectively subtract the plurality of input systematic bit soft information values from the plurality of output systematic bit soft information values to generate a set of modified systematic bit soft information values; and a plurality of parity subtractors, configured to respectively subtract the plurality of input parity bit soft information values from the plurality of output parity bit soft information values to generate a set of modified parity bit soft information values.

* * * * *